(12) United States Patent
Ning

(10) Patent No.: US 9,203,409 B2
(45) Date of Patent: Dec. 1, 2015

(54) WAFER-LEVEL STACKED CHIP ASSEMBLY AND CHIP LAYER UTILIZED FOR THE ASSEMBLY

(71) Applicant: Shu-Liang Ning, Taoyuan (TW)

(72) Inventor: Shu-Liang Ning, Taoyuan (TW)

(*) Notice: Subject to any disclaimer, the term of this patent is extended or adjusted under 35 U.S.C. 154(b) by 1 day.

(21) Appl. No.: 14/337,807

(22) Filed: Jul. 22, 2014

(65) Prior Publication Data

US 2015/0028919 A1 Jan. 29, 2015

(30) Foreign Application Priority Data

Jul. 23, 2013 (TW) .............................. 102126344 A

(51) Int. Cl.
| | |
|---|---|
| *H03K 19/003* | (2006.01) |
| *H03K 19/20* | (2006.01) |
| *H03K 19/007* | (2006.01) |

(52) U.S. Cl.
CPC ............ *H03K 19/003* (2013.01); *H03K 19/007* (2013.01); *H03K 19/20* (2013.01)

(58) Field of Classification Search
CPC ................. H01L 25/0657; H01L 2224/16145; H01L 2225/06513; H01L 23/481; H01L 2225/06541; H01L 2225/06544; H01L 2224/06181; H01L 2223/54433; H01L 2223/5444; H01L 2224/17181; H01L 2225/06517; H01L 2225/06527; H01L 2225/06562
See application file for complete search history.

(56) References Cited

U.S. PATENT DOCUMENTS

| | | | | |
|---|---|---|---|---|
| 8,519,734 | B2 | 8/2013 | Jeong et al. | |
| 8,687,449 | B2* | 4/2014 | Yoko ......................... | G11C 5/04 365/189.05 |
| 2011/0050320 | A1 | 3/2011 | Gillingham | |
| 2011/0156034 | A1* | 6/2011 | Cui ...................... | G11C 29/702 257/48 |
| 2012/0007624 | A1* | 1/2012 | Byeon ....................... | G11C 7/10 324/750.15 |
| 2012/0163413 | A1* | 6/2012 | Kim .......................... | G01K 7/01 374/152 |
| 2013/0120021 | A1* | 5/2013 | Chi ..................... | H03K 19/1737 326/37 |

* cited by examiner

*Primary Examiner* — Alexander H Taningco
*Assistant Examiner* — Seokjin Kim
(74) *Attorney, Agent, or Firm* — Muncy, Geissler, Olds & Lowe, P.C.

(57) ABSTRACT

Disclosed is a wafer-level stacked chip assembly, comprising a plurality of chip layers vertically stacked together with vertically electrical interconnections between the adjacent chip layers realized by TSVs (Through Silicon Via). Each chip layer includes a switching mechanism for selectively bypassing chip coding sequence to deactivate failed IC area and its chip coding sequence, thereby the interconnection relationship among the chip layers can be re-defined and the function and chip code of the failed IC area can be deactivated. Accordingly, any known failed chip in the wafer-level stacking chip assembly can be controlled as a dummy chip to realize the wafer-level chip stacking of non-known good dices with exclusion of failed chip(s).

15 Claims, 7 Drawing Sheets

WAFER-LEVEL STACKED CHIP ASSEMBLY AND CHIP LAYER UTILIZED FOR THE ASSEMBLY

FIELD OF THE INVENTION

The present invention relates to a 3D IC chip stacking assembly of semiconductor chips and more specifically to a wafer-level stacked chip assembly and a chip layer utilized for the assembly.

BACKGROUND OF THE INVENTION

The purpose of the development of 3D IC for semiconductor chips is to dispose more chips on the limited footprint of a printed circuit board. The conventional fabrication processes of 3D IC chip stacking assembly is to acquire Known Good Dice (KGD) firstly, then vertically stack these KGDs to be a 3D IC assembly. However, if there is a failed chip in a 3D IC assembly, the whole 3D IC is discarded since the existing chip codes cannot be changed and the failed chip is included during operation leading to errors.

In a conventional 2D package of semiconductor chips, chips are selected and activated by a controller through Chip Select (CS) which has been designated for individual chips. Therefore, when the control signal CS1 is sent by the controller for the first chip, only the first chip can react, operate, and function. When the control signal CS2 is sent by the controller for the second chip, only the second chip can react, operate, and function.

As the development of 3D IC, chips are vertically stacked on each other and are electrically interconnected by Through Silicon Via (TSV). In order to control the vertically stacked chips with perpendicular electrical interconnection, the conventional control methodology is to implement staggered method to interconnect adjacent chips so that the controller can send commands to a certain chip for certain operations. The signals sent by the controller including commands, addresses, data, etc. are always transmitted from the top chip layer or from the bottom chip layer where the original CS command is designated and sent along with other signals to all chip layers, however, only the selected chip would accept the CS command from the controller and react accordingly. Gillingham taught one of conventional 3D IC chip assemblies referring to US Patent Publication No. US 2011/0050320 A1 for more detail. As described in this patent, the left-side first TSV of the first chip layer is electrically connected to the left-side second TSV of the second chip layer; the left-side second TSV of the first chip layer is electrically connected to the left-side third TSV of the second chip layer. In order to avoid floating of the left-side first TSVs of all chip layers except for the first chip layer which are not connected to any components, the left-side first TSV of each chip layer is not only connected to left-side second TSV of an upper chip layer but also connected to the left-side first TSVs of the upper chip layer. Through the interconnection arrangement, all vertically stacked chip layers with the corresponding array can clearly be defined and signal floating can be avoided.

The about mentioned CS is implemented in 3D IC assembly through staggered interconnection of CS signals achieved by physical 3D IC package structure. An alternative is developed by the coding methodology to replace the corresponding CS signals, i.e., to give each chip layer a corresponding array, an implementation of ID concept, through a sequence generator. Then, the specific ID array is decoded by a decoder to generate an activated signal where the corresponding I/O gates are activated to receive the corresponding signals sent from the controller so that the CS signal sent by the controller is accepted by a certain corresponding chip layer then to accept further commands for further operation.

Basically, the logic of a sequence generator always generates N output values when there are N input values. For example, if there are N input values to input nodes (in0, in1, in2, in3, . . . inN), there are N corresponding output values from output nodes (out0, out1, out2, out3, . . . outN), i.e., the input values and the output values are one-to-one corresponded. Furthermore, each output value is a function sequence of one corresponding input value, for example, output values (out0, out1, out2, out3, . . . outN)=F input values (in0, in1, in2, in3; . . . inN) and not every input value is equal to the corresponding output value, for example, output values (out0, out1, out2, out3, . . . outN)≠input values (in0, in1, in2, in3, . . . inN).

Since the function and the operation of a sequence generator is well-known in the field, therefore, only simple examples are illustrated as follows.

Basically, no matter it is a binary sequence generator or a triplet sequence generator, . . . or even N-bit sequence generator, the desired array is acquired by digital assembly algorithm. An example of input values and output values of a sequence generator is shown in Table 1 as follows.

TABLE 1

| Chip Layer | in1 | in0 | out1 | out0 |
|---|---|---|---|---|
| 0 | 0 | 0 | 0 | 1 |
| 1 | 0 | 1 | 1 | 0 |
| 2 | 1 | 0 | 1 | 1 |
| 3 | 1 | 1 | 0 | 0 |

A binary sequence generator can be referred to US Patent Publication No. US 2011/0050320 A1 for more detail.

Furthermore, the triplet sequence generator is illustrated by a ring counter to be used by I/O gates, where input values and output values of the triplet sequence generator are shown in Table 2 as follows.

TABLE 2

| Chip Layer | in2 | in1 | in0 | out2 | out1 | out0 |
|---|---|---|---|---|---|---|
| 0 | 0 | 0 | 0 | 1 | 0 | 0 |
| 1 | 1 | 0 | 0 | 1 | 1 | 0 |
| 2 | 1 | 1 | 0 | 1 | 1 | 1 |
| 3 | 1 | 1 | 1 | 0 | 1 | 1 |

The specific array generated either by binary sequence generator or by triplet sequence generator is gone through a decoder with a set of corresponding I/O gates to decide which chip layer is corresponding to the CS command.

As shown in FIG. 1, a chip layer 200 in a conventional 3D IC assembly has a conventional decoder 260 and a plurality of I/O gates 231. The array generated by a binary sequence generator is input into the decoder 260 where the input values are sent through input nodes C0 and C1. The output values sent through output nodes (G0, G1, G2, and G3) from the decoder 260 are corresponding to specific arrays to activate the I/O gates 231. For example, when the input values to the decoder 260 of the first chip layer are (0, 0), then the corresponding array of the first chip layer sent from the decoder 260 are (G0, G1, G2, G3)=(1, 0, 0, 0).

Therefore, after decoding by the decoder 260, only the I/O gates 231 of the first chip layer are activated and the rest of the I/O gates of other chip layers are not activated so that only CS1 enters the allocated chip layer to be CS for the first chip layer and accept and react all signals from the controller with the corresponding functions and operation.

Similarly, when the input values are (1, 0) and sent to the decoder 260 of the second chip layer, then the corresponding array of the second chip layer sent from the corresponding decoder 260 are (G0, G1, G2, G3)=(0, 1, 0, 0). After decoding by the decoder 260, only the I/O gate 231 of the second chip layer are activated and the rest of the I/O gates of other chip layers are not activated so that only CS2 enters the second chip layer to be CS for the second chip layer and accept and react all signals from the controller with the corresponding functions and operation. In the same way with the same algorithm, the third chip layer and the fourth chip layer only accept CS3 and CS4 as CS commands to accept and react all signals from the controller with the corresponding functions and operation.

This above mentioned algorithm with the control methodology is quite different from the one using staggered interconnection of CS signals achieved by physical 3D IC package structure. However, no matter I/O gates signals (G0, G1, G2, G3) are selected either by direct assignment or by a sequence generator, the existing control methodology is to assign a group of CS signals to each chip layer activated by the commands sent by the controller to the corresponding chip layer for the corresponding functions and operation where the chip coding sequence has to be strictly corresponding to the stacking sequence of 3D IC. Once there is a failed chip layer or failed chip layers among the 3D IC, the whole 3D IC would be malfunctioned and discarded leading to poor overall yield issues.

FIG. 2 is an illustration of 3D IC fabrication processes of a conventional wafer-level stacked chip assembly where it is clearly illustrated that all the individual chip layers 200 have to be tested first to be KGD and only can be vertically stacked after singulation including vertically stacking a plurality of chip layers 200 on a substrate 40 with a controller 30 adjacent to the stacked chip assembly to drive the desired chip layer 200. Once there are one or several failed chip layers, the whole stacked chip assembly is malfunctioned and discarded.

SUMMARY OF THE INVENTION

The main purpose of the present invention is to provide a wafer-level stacked chip assembly and chip layers utilized for the assembly to resolve packaging yield issues of the conventional chip stacked assembly when involving a failed chip layer or failed chip layers in the stacked chip assembly after packaging and testing where the conventional whole chip stacked assembly has to be discarded to realize the mass production and implementation of wafer-level stacked chip assembly.

The second purpose of the present invention is to provide a wafer-level stacked chip assembly and chip layers utilized for the assembly to provide chip stacking flexibility either in packaging processes or in testing processes for the wafer-level stacked chip assembly.

According to the present invention, a wafer-level stacked chip assembly is revealed, comprising two or more stacked chip layers where each chip layer includes a switching mechanism for selectively bypassing chip coding sequence, a plurality of vertical download terminals, a plurality of upload terminals, and an IC circuitry area. The switching mechanism is built inside each corresponding chip layer where the switching mechanism comprises a plurality of vertically interconnected input terminals and output terminals, a sequence generator, a decoder, a plurality of multiplexers, and a chip shutter. Each transmitting path between the input terminals and the output terminals can be divided into a coding path and a non-coding bypass. The sequence generator is connected to the coding paths to define the corresponding identification code of an allocated one of the chip layers. The decoder is connected to a plurality of I/O gates between the sequence generator and the IC circuitry area wherein the decoder has a plurality of first input nodes to receive a corresponding identification code generated by the corresponding sequence generator. The multiplexers are connected between the output terminals and the input terminals wherein each multiplexer has a second input node connected to the sequence generator through the coding path and a third input node connected to the non-coding bypass respectively, an output node of each multiplexer is connected to the corresponding one of the output terminals. The chip shutter is disposed inside the chip layer for closing the I/O gates of the corresponding IC circuitry area with a closing priority comparing to the decoder, wherein the chip shutter is also connected to a selected node of each multiplexer to switch the selection of the multiplexers between the coding paths and the non-coding bypasses.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
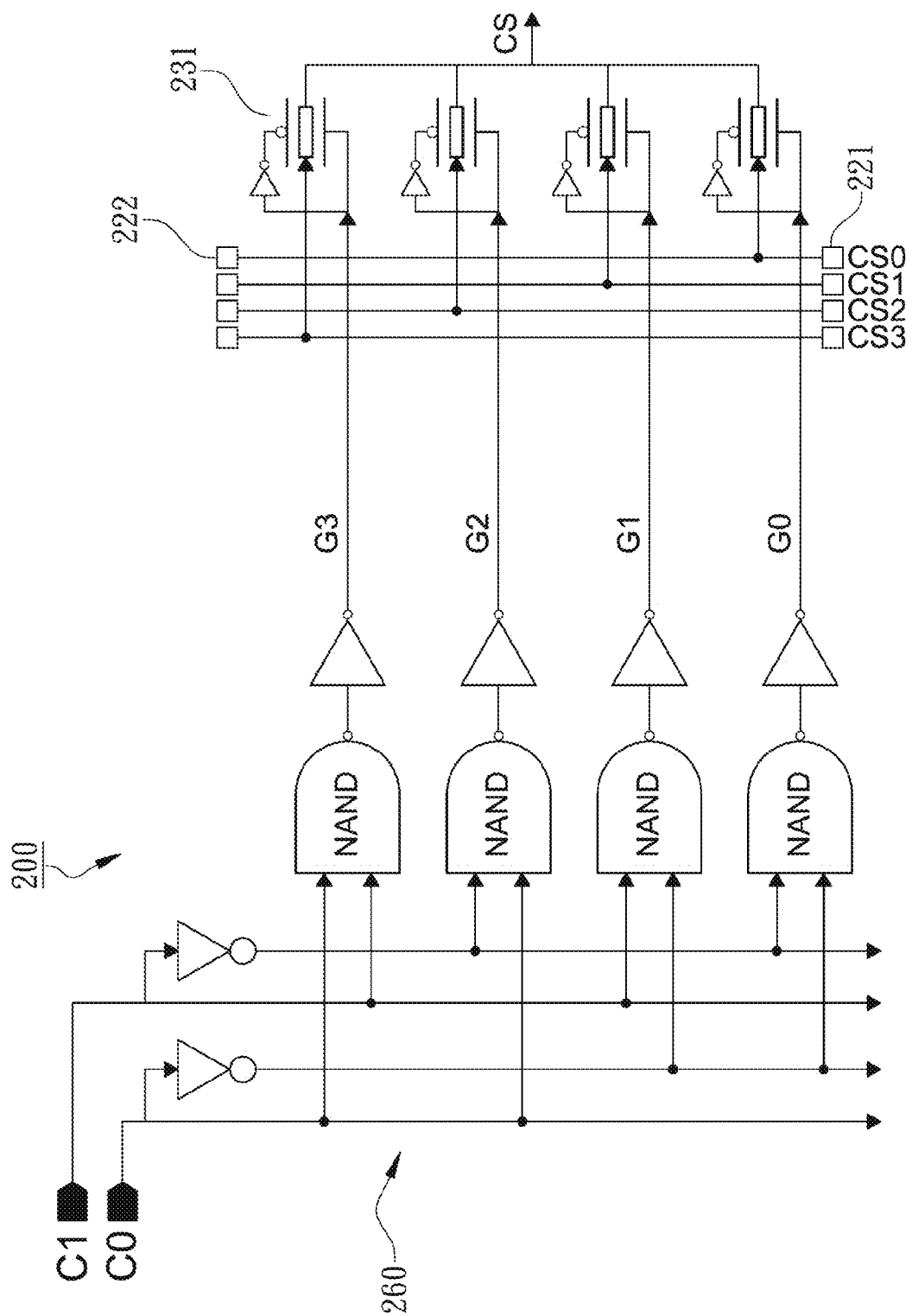
FIG. 1 is a partial circuit diagram illustrated the interconnection between the decoder and the I/O gates inside a chip layer of a conventional chip-level stacked chip assembly.
Figure 2:
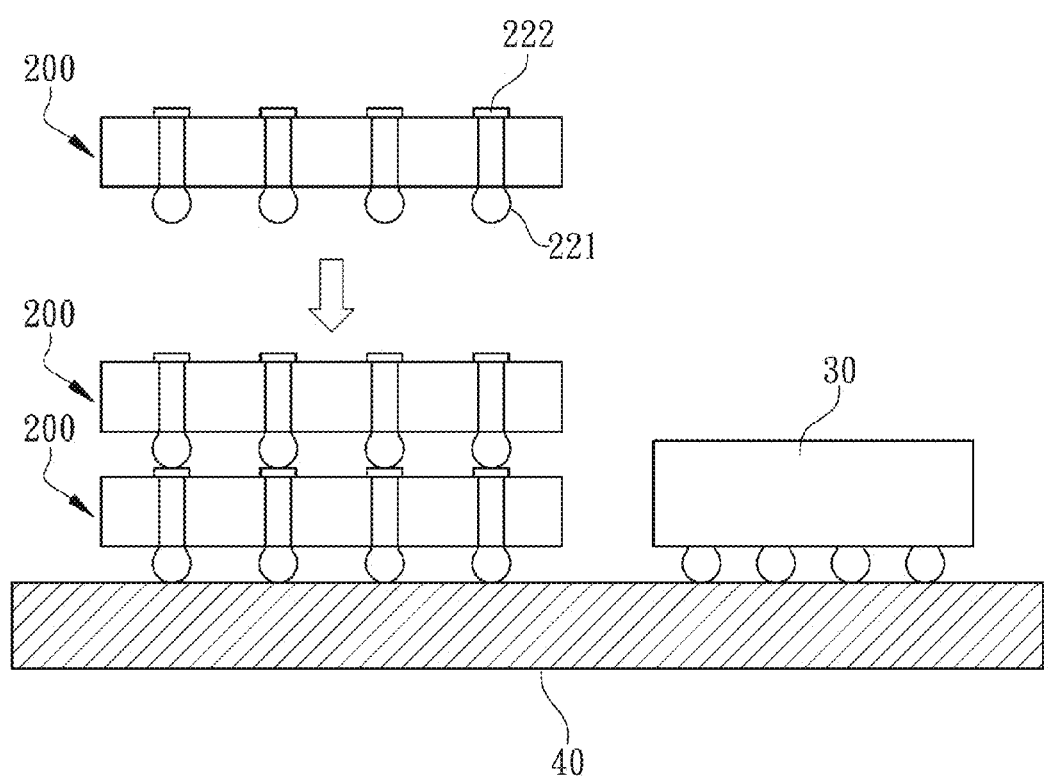
FIG. 2 is an illustration of the chip-level fabrication processes of the conventional chip-level stacked chip assembly.
Figure 3:
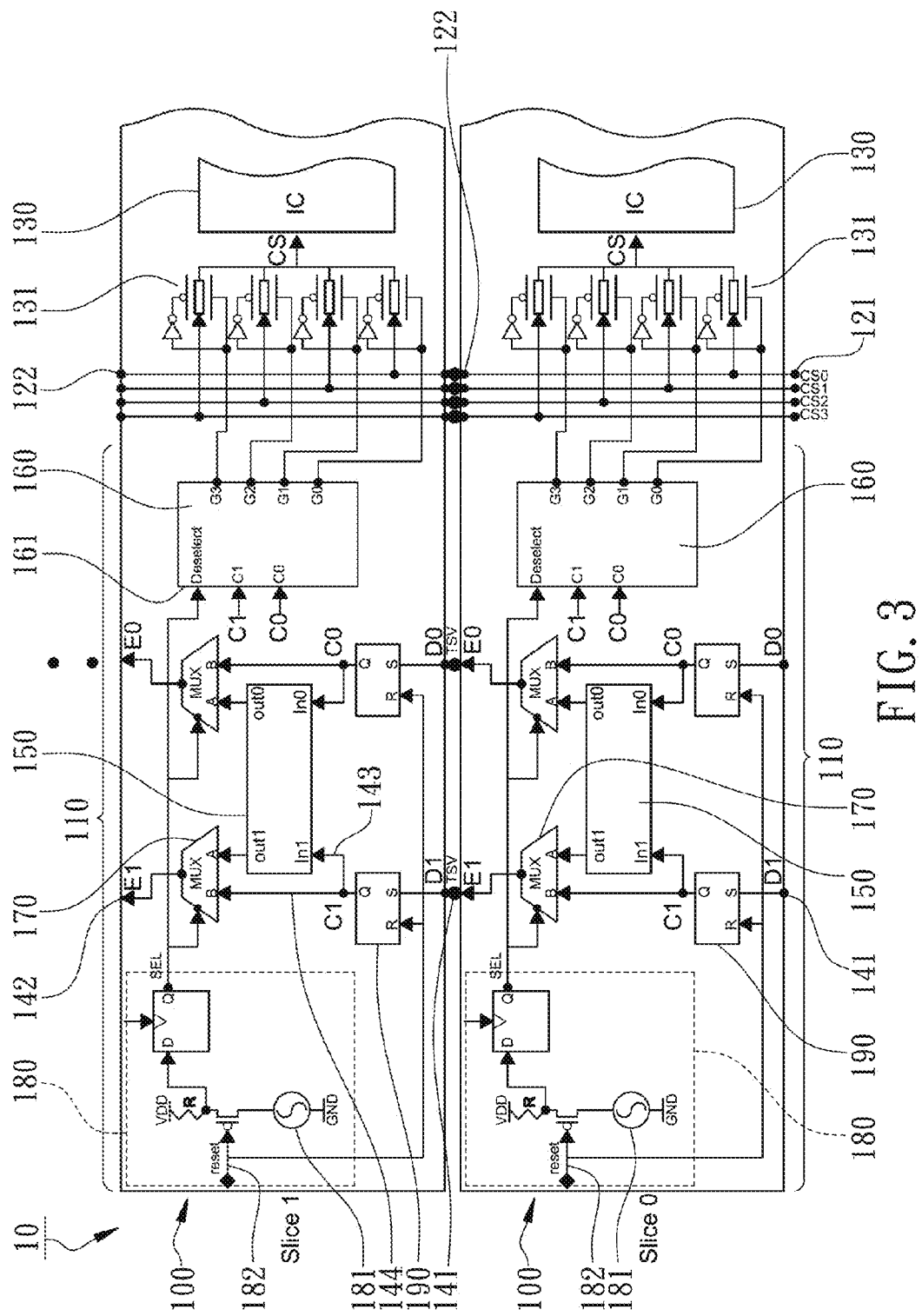
FIG. 3 is a partial circuit diagram of a wafer-level stacked chip assembly according to the first embodiment of the present invention.

According to the first embodiment of the present invention, a wafer-level stacked chip assembly is illustrated in FIG. 3 for a partial circuit diagram. The wafer-level stacked chip assembly 10 comprises two or more vertically stacked chip layers 100 where each chip layer 100 comprises a switching mechanism 110 for selectively bypassing chip coding sequence, a plurality of vertical download terminals 121, a plurality of vertical upload terminals 122, and an IC circuitry area 130. The switching mechanism 110 is built inside each corresponding chip layer 100. The vertical download terminals 121 and the vertical upload terminals 122 have the vertical corresponding relationship. In the present embodiment, for example, the vertical download terminals 121 are electrically connected to the vertical upload terminals 122 by TSVs as signal I/O pins. The IC circuitry area 130 specifically is a non-volatile memory area such as NAND flash but without limitation, the IC circuitry area 130 also can be various memory such as DRAM, NOR flash, FPGA, etc. The switching mechanism 110 has the function of skipping one-time chip code sequence and shutting down the corresponding IC circuitry area 130 of a failed chip layer 100 which can be within the same stacked chip assembly or any adjacent chip layers according to the chip coding sequence. In FIG. 3, only two chip layers 100 have been illustrated for easy comprehension. In the actual product, the number of the stacked chip layer 100 of a wafer-level stacked chip assembly 10 can be four or above or even up to eight or sixteen.

Figure 4:
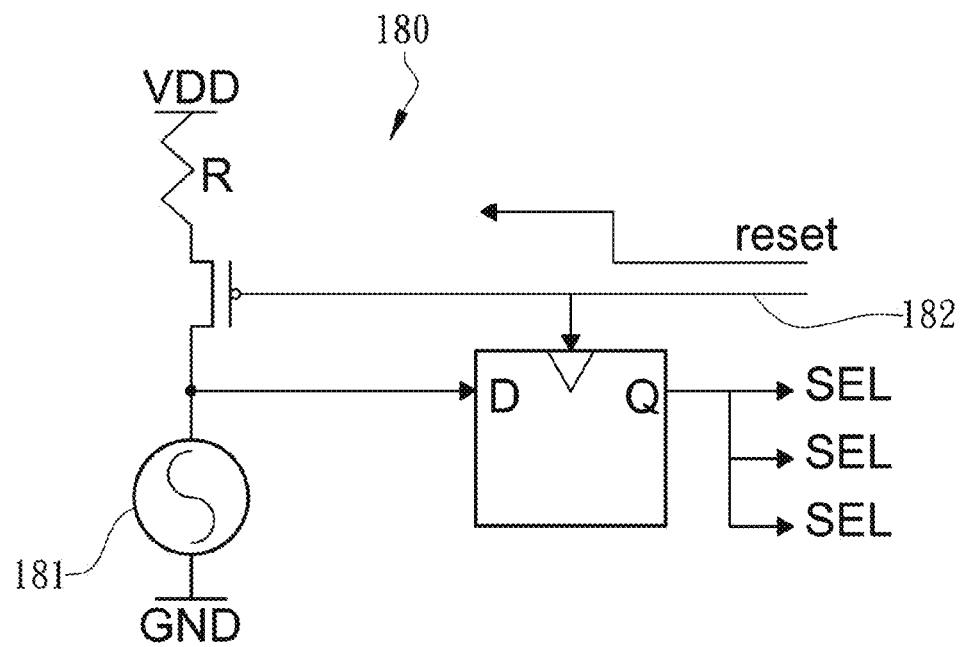
FIG. 4 is an illustration when the chip shutter of the chip layer of the wafer-level stacked chip assembly is deactivated according to the first embodiment of the present invention.
Figure 5:
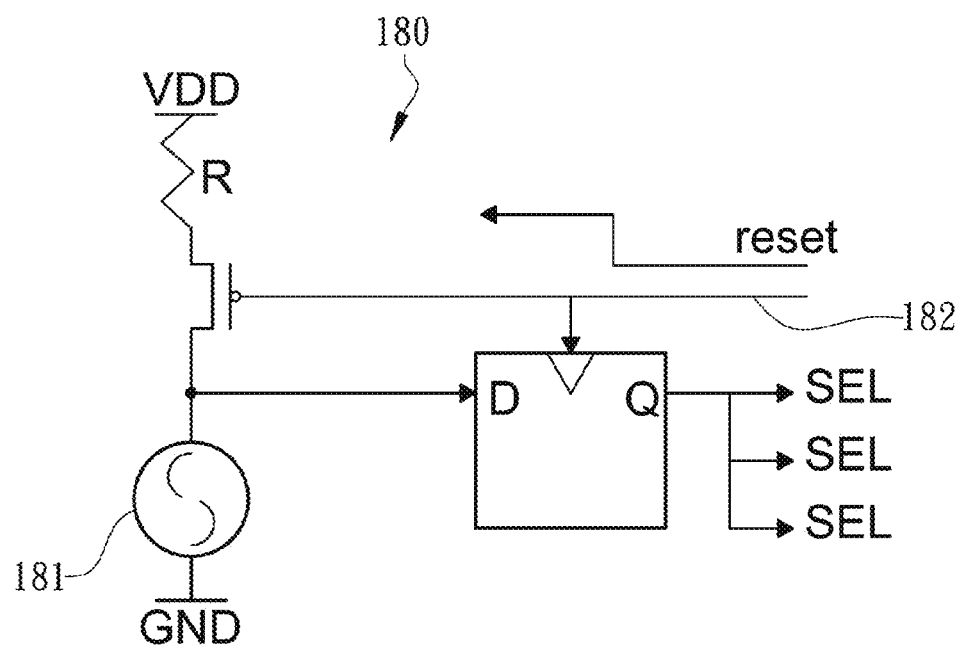
FIG. 5 is an illustration when the chip shutter of the chip layer of the wafer-level stacked chip assembly is activated according to the first embodiment of the present invention.

The switching mechanism 110 comprises a plurality of vertically interconnected input terminals 141 and output terminals 142, a sequence generator 150, a decoder 160, a plurality of multiplexers 170, and a chip shutter 180. There are a plurality of transmitting paths connect the input terminals 141 with the corresponding output terminals 142 where the input terminals 141 and the output terminals 142 are located at the opposing surfaces of the same chip layer 100. As shown in FIG. 3, the input terminals 141 can be located at D0 and D1 positions and the output terminals 142 can be located at E0 and E1 positions. The input terminals 141 and the output terminals 142 are specifically conducted bumps such as copper pillar bumps or gold bumps where FIG. 4 illustrates when the chip shutter 180 is deactivated and the FIG. 5 illustrates when the chip shutter 180 is activated.

Each transmitted path between the input terminals 141 and the corresponding output terminals 142 is divided into a coding path 143 and a non-coding bypass 144 where the sequence generator 150 is connected to the coding paths 143 to define the corresponding identification code of an allocated one of the chip layers 100. The allocated chip layer is one of the chip layers 100 having the sequence generator 150 or another adjacent good chip layer stacked on the one of the chip layers 100 having the sequence generator 150. In this embodiment, the allocated chip layer is another chip layer, that is to say, the corresponding identification code generated from the sequence generator 150 is assigned to next stacked good chip layer. The non-coding bypasses 144 do not connected to the sequence generator 150 but directly connected to the multiplexers 170. As shown in FIG. 3 again, after the input values at the input terminals In0, In1 go through the sequence generator 150, another set of logic array is generated to be the specific identification code for next stacked chip layer. According to different interconnection, identification code for each stacked chip layer generated by the sequence generator 150 can be corresponding to an adjacent good chip layer 100. Even an adjacent failed chip layer 100 has the same identification code, the chip function of the failed chip layer 100 is closed and its sequence is stopped by the chip shutter 180. Therefore, every good chip layer 100 must correspond to one counted identification code in sequence. Since there is possible that failed chip layer can be located on the same level, the circuitry design can be much easier without complication. The failed chip layer may include the following causes such as IC damage, poor vertical interconnection of the download and upload terminals, excessive lower threshold operation frequency, or algorithm mistakes caused by IC circuitry inside chip layers.

Figure 6:
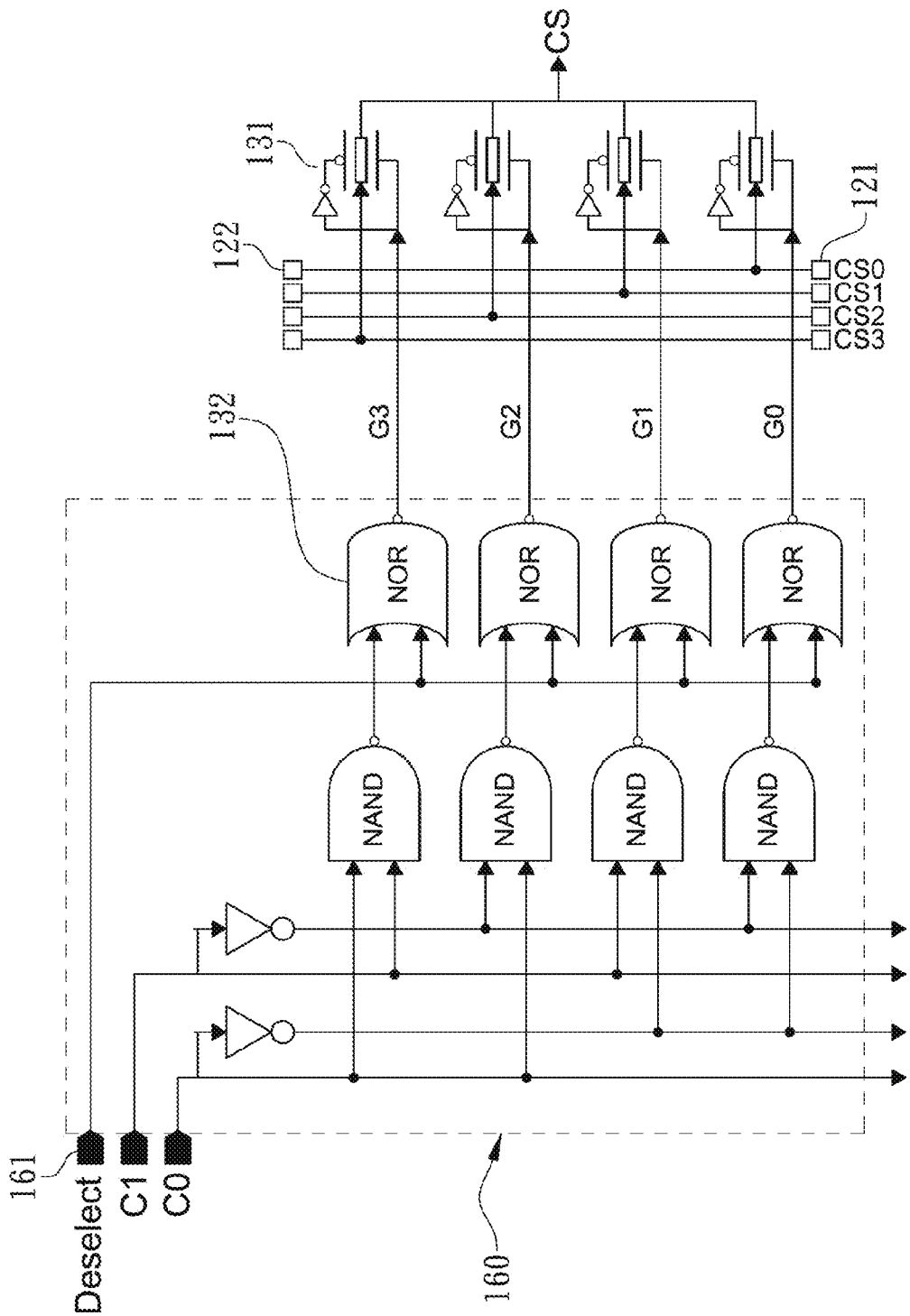
FIG. 6 is a partial circuit diagram illustrated the interconnection between the decoder and the I/O gates inside a chip layer of the wafer-level stacked chip assembly according to the first embodiment of the present invention.

FIG. 6 is to illustrate the interconnection between the decoder 160 and the I/O gates 131. The decoder 160 is connected to a plurality of I/O gates 131 disposed between the sequence generator 150 and the IC circuitry area 130. Therein, the decoder 160 has a plurality of first input nodes C0, C1 to receive a corresponding identification code generated by the corresponding sequence generator 150. In this embodiment, the corresponding identification code is generated by a sequence generator 150 of a pre-stacked lower good chip layers 100. The output nodes (G0, G1, G2, G3) of the decoder 160 are connected to the I/O gates 131 of the IC circuitry area 130. According to the interconnection, one set of the decoder 160 and the corresponding sequence generator 150 can be located at two adjacent good chip layers 100. Alternatively, the decoder 160 and the corresponding sequence generator 150 are located within the same chip layer 100. As shown in FIG. 3, the first input nodes (C0, C1) of the decoder 160 are connected to the connected points (C0, C1) of the transmitted paths before the input nodes (In0, In1) of the sequence generator 150 where the output nodes (out0, out1) from the sequence generator 150 are connected and uploaded to the adjacent chip layer 100 through the multiplexers 170. And the output nodes (out0, out1) from the sequence generator 150 may not be connected to the decoder 160 on the same chip layer 100. In the present embodiment, the interaction between the decoder 160 and the corresponding sequence generator 150 are located at two adjacent chip layers 100 respectively. The sequence generator 150 of the lower good chip layer 100 provides an identification code for the decoder 160 of the adjacent, upper, and good chip layer 100 above which is under the condition that the chip shutter 180 of the upper good chip layer 100 above is deactivated. When the chip shutter 180 of an adjacent failed chip layer 100 above is activated, the identification code provided by the lower chip layer 100 skips the upper stacked failed chip layer 100 and keep the same identification code until connecting to the decoder 160 of the next stacked good chip layer 100 one or more layers above. In a preferred embodiment, the decoder 160 has a deselect node 161 where the chip shutter 180 is connected to the deselect node 161 of the decoder 160 to obtain the closing priority. Moreover, the decoder 160 selectively operates the appropriate I/O gates according to the commands sent by the controller where the decoding methodology is not described in detail herein.

The multiplexers 170 are connected between the output terminals 142 and the input terminals 141 where wherein each multiplexer 170 has a second input node A connected to the sequence generator 150 through the coding path 143 and a third input node B connected to the non-coding bypass 144 respectively, an output node of each multiplexer 170 is connected to the corresponding one of the output terminals 142 as shown in FIG. 3. The input signals of the multiplexers 170 are chosen either from the coding path 143 or from the non-coding bypass 144 according to the definition of SEL signal line.

The chip shutter 180 is disposed inside the corresponding chip layer 100. The major function of the chip shutter 180 is for closing the I/O gates 131 of the IC circuitry area 130 with a closing priority comparing to the decoder 160 so that the closed I/O gates 131 are completely isolated with the download terminals 121 when the chip shutter 180 is activated. The chip shutter 180 is also connected to a select node of each multiplexer 170 by a SEL line to switch the selection of the multiplexers 170 between the coding paths 143 and the non-coding bypasses 144 through the control of the open/short conditions of the second input nodes A and the third input nodes B. Either the third input nodes B of the multiplexers 170 connected to the non-coding bypasses 144 or the second input nodes A of the multiplexers 170 connected to the coding paths 143 are selected according to the chip shutter 180 is activated or not. When the chip shutter 180 is activated, the I/O gates 131 are closed whatever the decoder 160 is worked or not. Preferably, the chip shutter 180 specifically includes a fuse 181 to provide an activating command from the chip shutter 180 when the fuse 181 is broken so that the third input nodes B of the multiplexers 170 are selected to allow the input terminals 141 are connected with the corresponding output terminals 142 through the non-coding bypasses 144 by skipping the sequence generator 150. In a different embodiment, a chip layer activating command can be provided by the open/short status of the fuse 181. In other words, the status of the IC circuitry area 130 on the same chip layer 100 can be acquired by the fuse 181 to send a deactivating command or an activating command to the multiplexers 170 through SEL signal line. Based on the command, the multiplexers 170 select to go through non-coding bypass 144 or to go through coding path 143 according to the pre-defined algorithm to let the output signal from the latch circuits 190 to be the input signal of the lower or upper chip layer 100 or to let the logic array generated by the sequence generator 150 to enter the decoder 160 of the lower or upper chip layer 100.

To be more specific, the switching mechanism 110 further comprises a plurality of latch circuits 190 connected to the multiplexers 170, the sequence generator 150 and the decoder 160 and also connected to the input terminals 141 where the contact points S of the latch circuits 190 as shown in FIG. 3 are the input points from the input terminals 141. The contact points Q of the latch circuits 190 are the output points to the multiplexers 170, the sequence generator 150, and the decoder 160. Therefore, the latch circuits 190 can provide an initial value to the sequence generator 150 and the decoder 160 so that the output signals from the latch circuits 190 are transmitted to the third input nodes B of the multiplexers 170, to the first input nodes C0, C1 of the decoder 160 and to the sequence generator 150 as shown in FIG. 3. Furthermore, the switching mechanism 110 further comprises a reset circuit 182 connected the chip shutter 180 with the latch circuits 190 where the reset circuit 182 can connect to the contact point R of the latch circuits 190 as shown in FIG. 3. The latch circuits 190 are able to latch the input signal from the input terminal 141 or the reset signal from the reset circuit 182 to provide an initial value. In the present embodiment, for example, since the decoder 160 of the bottom chip layer 100 cannot receive an identification code from the sequence generator 150 of the chip layer 100 further below, the latch circuits 190 on the same chip layer 100 provide an initial value and is transmitted to the first input nodes C0, C1 of the decoder 160 where the initial values from the output terminals Q of the latch circuits 190 also become the input values In0, In1 of the sequence generator 150 to generate a logic array as identification code to be the output values out0, out1 from the sequence generator 150. When the multiplexers 170 accepts the command from the SEL signal line, the logic array from the sequence generator 150, and the output signals from the latch circuits 190, the multiplexers 170 select one type of transmitted paths through the second input nodes A or through the third input nodes B according to the command definition. When the allocated chip layer 100 is good, the multiplexers 170 select the second input nodes A and let the logic array of the sequence generator 150 go through to enter the next chip layer 100. Moreover, the output signal from the latch circuits 190 or the logic array from the sequence generator 150 can be input values of different decoder 160 to be CS to the corresponding chip layer 100.

As shown in FIG. 4 and FIG. 5, the fuse 181 is composed by connecting a current limiting resistor to VDD. When the reset signal is sent, the logic values from the contact point D are latched at the contact point Q. Through the selection of SEL signal lines, the fuse 181 can be connected to the multiplexers 170 and to be controlled by the reset signal. When one of the stacked chip layer 100 has a good chip function, the inside fuse 181 is conducted. As shown in FIG. 4, the chip shutter 180 is not activated so that the signals from the rest circuit 182 are conducted to the GND without activating the chip shutter 180. Therefore, the input signals for the multiplexers 170 are connected to the coding paths 143 so that the KGD chip layer 100 can be normally coding where the IC circuitry area 130 can be driven, i.e., the second input nodes A is open and the contact point B is close according to the definition when a chip layer is normally activated or a chip layer is under no command. Furthermore, the reset signal is sent to the latch circuits 190 to generate the initial values mentioned above.

As shown in FIG. 5, when a chip layer 100 is a failed chip, the fuse 181 can be broken by either high voltage or by laser. The signal from the reset circuit 182 can be sent to activate the chip shutter 180. When the chip shutter 180 is activated, a shutting command is sent to the multiplexers 170 through the corresponding SEL signal lines so that the input signal of the multiplexers 170 connect to the non-coding bypasses 144, i.e., the third input nodes B are connected and the second input nodes A do not be selected as shown in FIG. 3. At the same time, the shutting command is sent to the deselect node 161 of the decoder 160 to close the I/O gates 131. When the chip shutter 180 is not activated, a deactivated or no command is sent to the decoder 160 through one of the SEL signal lines connected to the deselect node 161 of the decoder 160, the decoder 160 does not make any deselect action where the corresponding I/O gates 131 to the corresponding IC circuitry area 130 can be selectively close or open. In other words, the shutting command orders the output signals of the decoder 160 along with the connected I/O gates 131 all to be compulsory closed and accept no command from the controller. However, in the present invention, it is not limited that the fuse 181 of the KGD is conducted so that the chip shutter 180 does not be activated. The alternative is to interchange the multiplexers 170 so that the chip shutter 180 is activated when the chip layer is KGD and change the deactivating command into activating command. Through the SEL signal lines given to the multiplexers 170, the input signals of the multiplexers 170 can be connected to the coding path 143 to normally perform coding and driving the IC circuitry area 130 of the KGD chip layer 100. Furthermore, in a different embodiment, the fuse 181 can be replaced by a memory device or any control circuit with memory.

Figure 7:
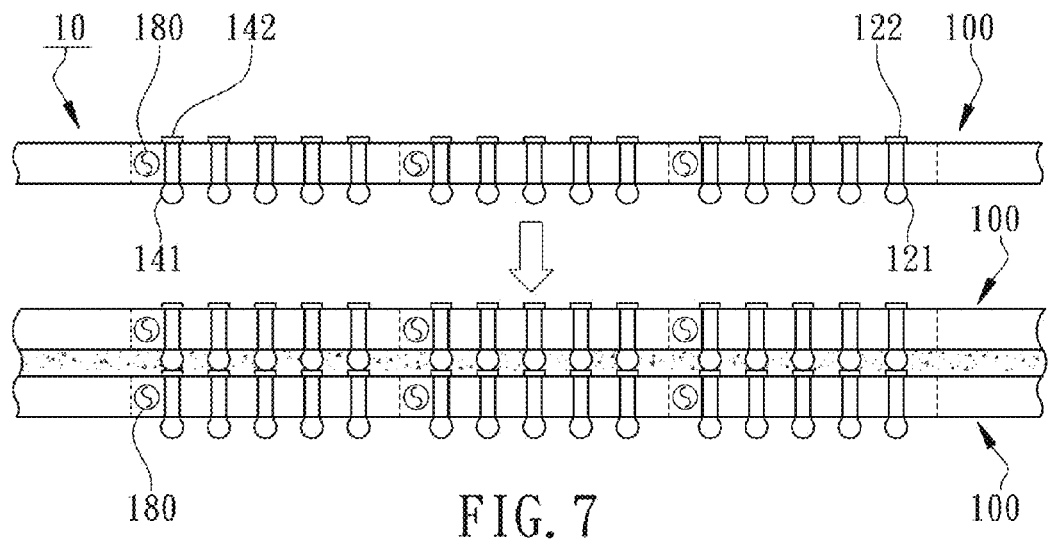
FIG. 7 is an illustration of the wafer-level fabrication processes of the wafer-level stacked chip assembly according to the first embodiment of the present invention.

FIG. 7 is to illustrate that the wafer-level stacked chip assembly 10 can be achieved by wafer-level stacking technology where the wafer-level stacked chip assembly 10 is fabricated by stacking whole wafers instead of by individual chips. With the function of the switching mechanism 110, any failed chip layer 100 is regarded as a dummy chip where the coding sequence of the chip is skipped to avoid the activation of the failed IC circuitry area 130. Therefore, even if there are failed chip layers 100 in the wafer-level stacked chip assembly 10, the coding sequence and the good IC circuitry area 130 do not be affected. In the present invention, no matter there are good chip layers or failed chip layers, the wafer-level stacking technology still can be implemented even with failed chip layers existing in the wafer-level stacked chip assembly 10 where the coding sequence of the failed chip layer 100 and the failed IC circuitry area 130 are skipped to achieve more flexibility in the wafer-level stacking technology. For example, all wafers can be stacked then followed by singulation and functional test can be performed after chip stacking so when there are failed chip layers 100 in the wafer-level stacked chip assembly 10, the failed chip layers 100 can be skipped or shut down. The wafer-level stacked chip assembly 10 is not discarded due to some failed chip layers 100.

Figure 8:
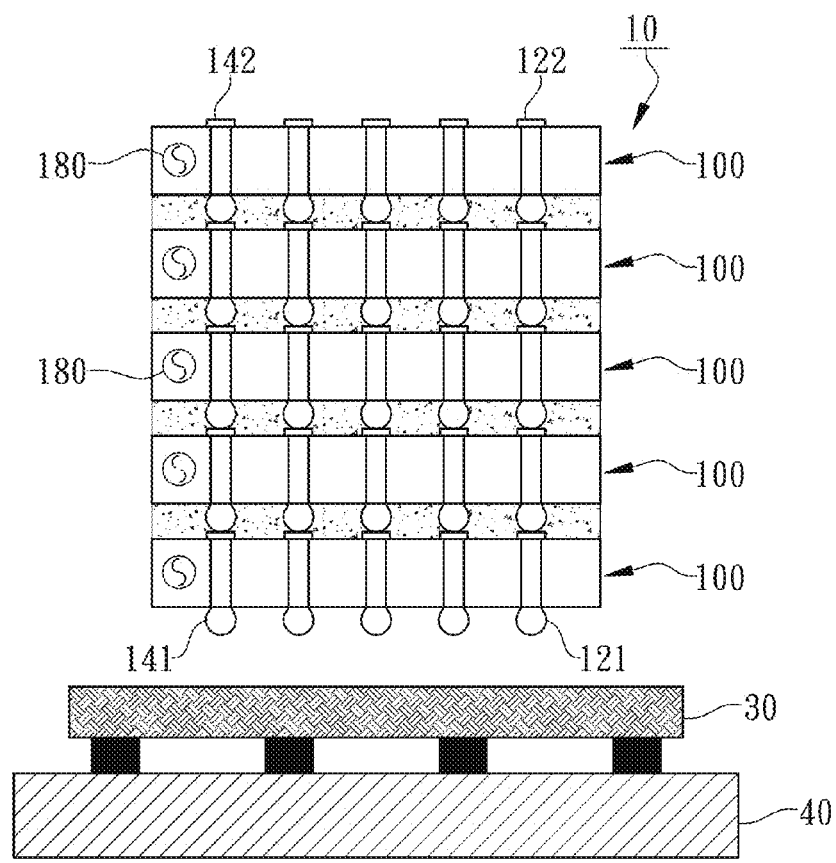
FIG. 8 is a cross-sectional view of the wafer-level stacked chip assembly joined on a controller where the controller is SMT on a substrate according to the first embodiment of the present invention.

FIG. 8 is a cross-sectional view of a wafer-level stacked chip assembly 10 joined on a controller 30 where the controller 30 is SMT on a substrate 40 where the wafer-level stacked chip assembly 10 is joined to a controller 30 where the controller 30 is SMT on a substrate 40 such as a printed circuit broad to reduce the overall footprint.

Therefore, a wafer-level stacked chip assembly and chip layers utilized for the assembly is revealed in the present invention where the coding sequence of the stacked chip layers 100 is not necessary the same as the chip stacking sequence. In a stacked assembly with four stacked chips, if the second chip layer is failed, then the first chip layer can be coded as 1 or a corresponding carrying number. The second failed chip layer is not coded or coded as X which is not included in the coding sequence and regarded as a dummy chip and being skipped. The third chip layer can be coded as 3 or the corresponding carrying number and the fourth chip layer can be coded as 4 or the corresponding carrying number where specific chip layers can be skipped or shut down according to the desired purpose to resolve packaging yield issues of the conventional chip stacked assembly when involving a failed chip layer or failed chip layers in the stacked chip assembly 10 after packaging and testing where the whole chip stacked assembly 10 has to be discarded to realize the mass production and implementation of wafer-level stacked chip assembly. Furthermore, the wafer-level stacked chip assembly 10 can provide chip stacking flexibility either in packaging processes or in testing processes. The wafer-level technology can be implemented in the chip stacking technology and the functional test can be performed after chip stacking where the deactivation of the failed chip layer 100 can be controlled.

Figure 9:
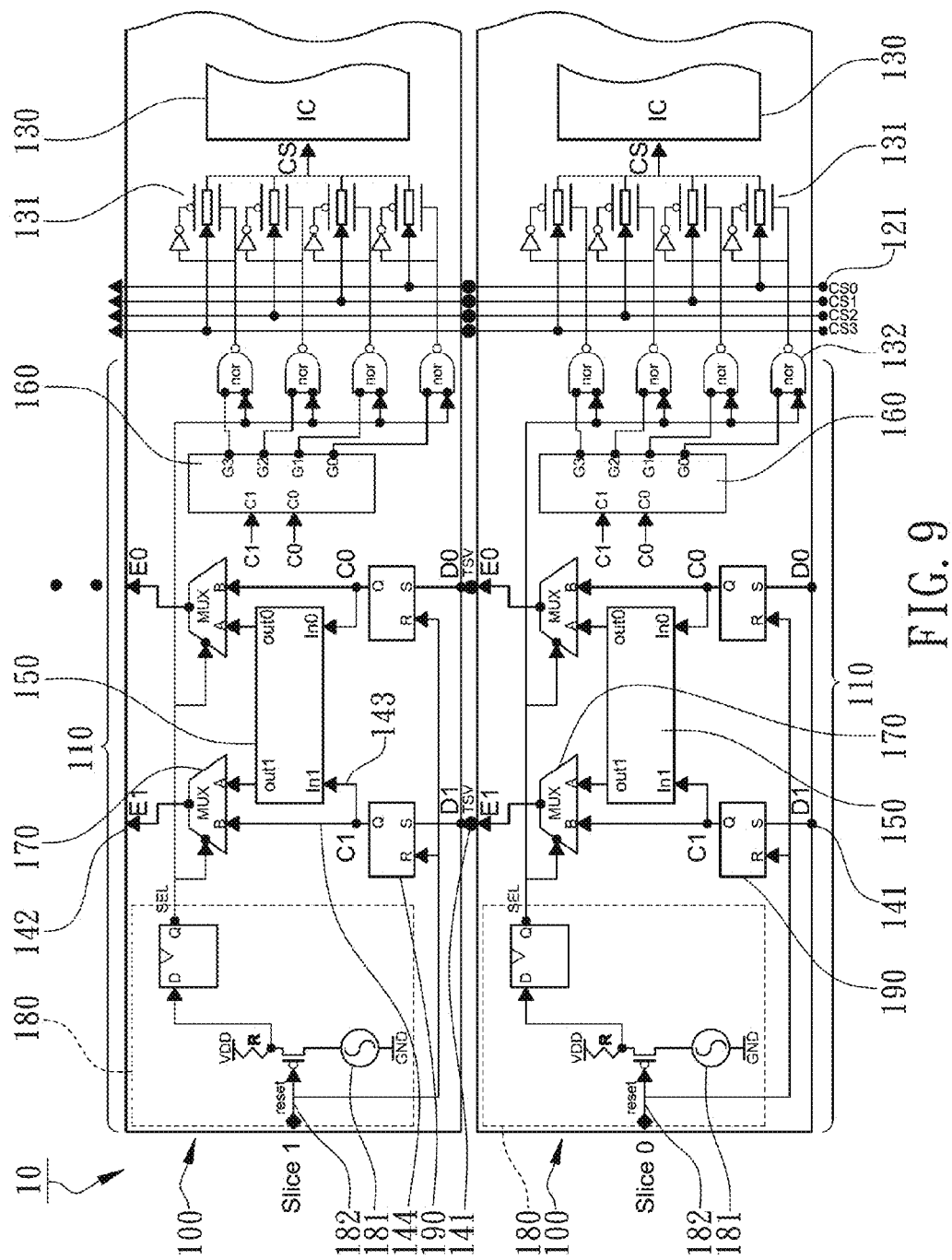
FIG. 9 is another partial circuit diagram of a wafer-level stacked chip assembly according to the second embodiment of the present invention.

According to the second embodiment of the present invention, another wafer-level stacked chip assembly 10 is illustrated in FIG. 9 for a partial circuit diagram where the technology contents of the second embodiment is similar to the content of the first embodiment. The wafer-level stacked chip assembly 10 comprises a plurality of two or more vertically stacked chip layers 100 where each chip layer 100 comprises a switching mechanism 110 for selectively bypassing chip coding sequence, a plurality of vertical download terminals 121, a plurality of vertical upload terminals 122, and an IC circuitry area 130. The switching mechanism 110 is built inside each corresponding chip layer 100 where the switching mechanism 110 comprises a plurality of vertically interconnected input terminals 141 and output terminals 142, a sequence generator 150, a decoder 160, a plurality of multiplexers 170, and a chip shutter 180.

Each transmitted path between the input terminals 141 and the corresponding output terminals 142 can be divided into a coding path 143 and a non-coding bypass 144 where the sequence generator 150 is connected to the coding paths 143 to define the corresponding identification code of an allocated one of the corresponding chip layers 100. The sequence generator 150 is connected to the coding paths 143 to define the corresponding identification code of an allocated one of the corresponding chip layers 100. The decoder 160 is connected to a plurality of I/O gates 131 disposed between the sequence generator 150 and the IC circuitry area 130, and the decoder 160 has a plurality of first input nodes C0, C1 to receive a corresponding identification code generated by the corresponding sequence generator 150. The multiplexers 170 are connected between the output terminals 142 and the input terminals 141 wherein each multiplexer 170 has a second input node A connected to the sequence generator 150 through the coding path 143 and a third input node B connected to the non-coding bypass 144 respectively, an output node of each multiplexer 170 is connected to the corresponding one of the output terminals 142. The chip shutter 180 is disposed inside the corresponding chip layer 100. The major function of the chip shutter 180 is to shut the I/O gates 131 of the IC circuitry area 130 with a closing priority where the chip shutter 180 is also connected to a select node of each multiplexer 170 through a signal line SEL to switch the selection of the multiplexers between the coding paths and the non-coding bypasses. In the present embodiment, the switching mechanism 110 further comprises a plurality of NOR logic gates 132 connected between the decoder 160 and the I/O gates of the IC circuitry area 130 where the chip shutter 180 is connected to the NOR logic gates 132.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A wafer-level stacked chip assembly comprising two or more vertically stacked chip layers, wherein each chip layer includes a switching mechanism for selectively bypassing chip coding sequence, a plurality of vertical download terminals, a plurality of vertical upload terminals, and an IC circuitry area, moreover the switching mechanism is built inside each corresponding chip layer and comprises:

a plurality of vertically interconnected input terminals and output terminals, whereas each transmitted path between the input terminals and the correspondingly output terminals is divided into a coding path and a non-coding bypass;

a sequence generator connected to the coding paths to define the corresponding identification code of an allocated one of the chip layers;

a decoder connected to a plurality of I/O gates disposed between the sequence generator and the IC circuitry area, wherein the decoder has a plurality of first input nodes to receive a corresponding identification code generated by the corresponding sequence generator;

a plurality of multiplexers connected between the output terminals and the input terminals, wherein each multiplexer has a second input node connected to the sequence generator through the coding path and a third input node connected to the non-coding bypass respectively, an output node of each multiplexer is connected to the corresponding one of the output terminals; and a chip shutter disposed inside the corresponding chip layer for closing the I/O gates of the IC circuitry area with a closing priority comparing to the decoder, wherein the chip shutter is also connected to a select node of each multiplexer to switch the selection of the multiplexers between the coding paths and the non-coding bypasses.

2. The wafer-level stacked chip assembly as claimed in claim 1, wherein the decoder further has a deselect node, wherein the chip shutter is connected to the deselect node.

3. The wafer-level stacked chip assembly as claimed in claim 1, wherein the switching mechanism further comprises a plurality of NOR logic gates connected between the decoder and the I/O gates of the IC circuitry area, wherein the chip shutter is connected to the NOR logic gates.

4. The wafer-level stacked chip assembly as claimed in claim 1, wherein either the third input nodes of the multiplexers connected to the non-coding bypasses or the second input nodes of the multiplexers connected to the coding paths are selected according to the chip shutter is activated or not.

5. The wafer-level stacked chip assembly as claimed in claim 4, wherein the chip shutter includes a fuse to provide an activating command from the chip shutter when the fuse is broken.

6. The wafer-level stacked chip assembly as claimed in claim 1, wherein the switching mechanism further comprises a plurality of latch circuits connected to the multiplexers, the sequence generator, and the decoder to provide an initial value to the sequence generator and the decoder.

7. The wafer-level stacked chip assembly as claimed in claim 6, wherein the switching mechanism further comprises a reset circuit connecting the chip shutter with the latch circuits.

8. The wafer-level stacked chip assembly as claimed in claim 1, wherein the vertical download terminals are electrically connected to the vertical upload terminals by a plurality of TSVs.

9. A chip layer comprising a switching mechanism for selectively bypassing chip coding sequence, a plurality of vertical download terminals and a plurality of vertical upload terminals, and an IC circuitry area, wherein the switching mechanism is built inside the chip layer and comprises:
  a plurality of vertically interconnected input terminals and output terminals, whereas each transmitted path between the input terminals and the corresponding output terminals is divided into a coding path and a non-coding bypass;
  a sequence generator connected to the coding paths to define the corresponding identification code of an allocated chip layer;
  a decoder connected to a plurality of I/O gates disposed between the sequence generator and the IC circuitry area, wherein the decoder has a plurality of first input nodes to receive a corresponding identification code generated by the corresponding sequence generator;
  a plurality of multiplexers connected between the output terminals and the input terminals, wherein each multiplexer has a second input node connected to the sequence generator through the coding path and a third input node connected to the non-coding bypass respectively, an output node of each multiplexer is connected to the corresponding one of the output terminals; and
  a chip shutter disposed inside the chip layer for closing the I/O gates of the IC circuitry area with a closing priority comparing to the decoder, wherein the chip shutter is also connected to a select node of each multiplexer to switch the selection of the multiplexers between the coding paths and the non-coding bypasses.

10. The chip layer as claimed in claim 9, wherein the decoder further has a deselect node, wherein the chip shutter is connected to the deselect node.

11. The chip layer as claimed in claim 9, wherein the switching mechanism further comprises a plurality of NOR logic gates connected between the decoder and the I/O gates of the IC circuitry area, wherein the chip shutter is connected to the NOR logic gates.

12. The chip layer as claimed in claim 9, wherein either the third input nodes of the multiplexers connected to the non-coding bypasses or the second input nodes of the multiplexers connected to the coding paths are selected according to the chip shutter is activated or not.

13. The chip layer as claimed in claim 12, wherein the chip shutter includes a fuse to provide an activating command from the chip shutter when the fuse is broken.

14. The chip layer as claimed in claim 9, wherein the switching mechanism further comprises a plurality of latch circuits connected to the multiplexers, the sequence generator, and the decoder to provide an initial value to the sequence generator and the decoder.

15. The chip layer as claimed in claim 14, wherein the switching mechanism further comprises a reset circuit connecting the chip shutter with the latch circuits.

* * * * *